United States Patent [19]

Kirkpatrick et al.

[11] Patent Number: 4,656,417
[45] Date of Patent: Apr. 7, 1987

[54] TEST CIRCUIT FOR DIFFERENTIAL CASCODE VOLTAGE SWITCH

[75] Inventors: Edward S. Kirkpatrick, Croton-on-Hudson; Eric P. Kronstadt, Hartsdale; Robert K. Montoye, Peekskill; Winfried W. Wilcke, Yorktown Heights, all of N.Y.

[73] Assignee: International Business Machines Corporation, Armonk, N.Y.

[21] Appl. No.: 759,804

[22] Filed: Jul. 29, 1985

[51] Int. Cl.⁴ ............................................. G01R 31/28
[52] U.S. Cl. .............................. 324/73 R; 324/158 R
[58] Field of Search ............ 324/73 R, 73 PC, 158 R; 307/579; 371/15, 25

[56] References Cited

U.S. PATENT DOCUMENTS

| 4,183,460 | 1/1980 | Yuen et al. | 324/73 R |
| 4,339,710 | 7/1982 | Hapke | 324/73 R |
| 4,410,816 | 10/1983 | Kanai | 324/73 R |

Primary Examiner—Ernest F. Karlsen
Attorney, Agent, or Firm—John J. Goodwin

[57] ABSTRACT

An improved testing and checking circuit for a Differential Cascode Voltage Switch which uses N-devices for both the invalid (0,0) and (1,1) state detection of Q and $\overline{Q}$ switch signals, and uses decoupling pass devices for sampling the data at the fall of the system C-clock, additionally allowing simultaneous pre-charging and error detection. The testing and checking circuit is incorporated in a hierarchical scheme, which uses the system C-clock for input to the latches, decoupling of the buffers, and pulling up and down the error lines. The error fault is held in a system latch. Also described is a circuit scheme which self tests a large macro using only the C-clock and latches the result in a single latch. More particularly, the described circuit employs the Q and $\overline{Q}$ signals in a NOR configuration, thus detecting if neither signal has sufficient voltage to pull down the load device which consists of a P-device whose gate is attached to the C-clock. The resulting signal is run to a gate in parallel with the two N-devices. Thus, the two low signals allow this NOR gate to rise and produce a pulldown leg to an error line. An invalid signal condition is detected if either both signals are sufficiently high to turn on an N-device or neither signal is high enough to turn on an N-device. Therefore, the described circuit registers a failure if and only if there is the potential for a tree with the same inputs to enter an invalid state.

7 Claims, 7 Drawing Figures

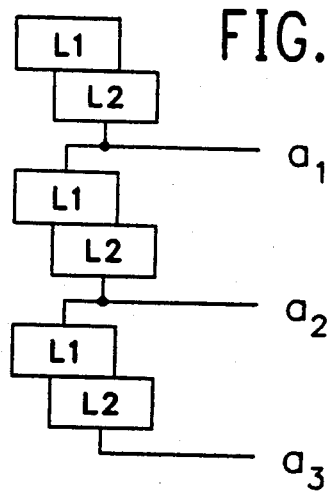
FIG. 6
FIG. 7
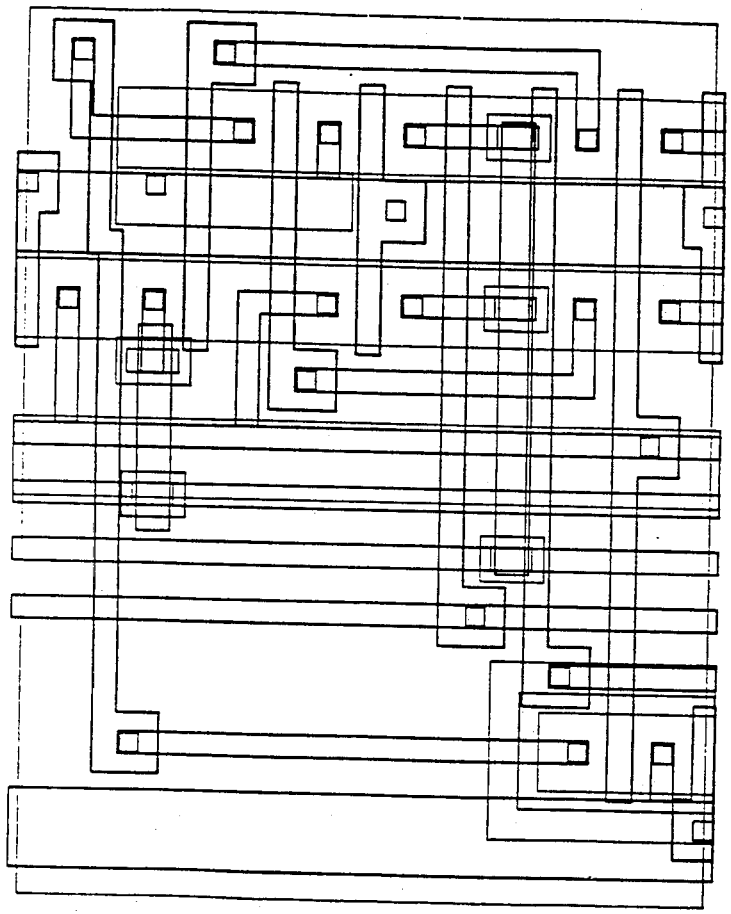

TEST CIRCUIT FOR DIFFERENTIAL CASCODE VOLTAGE SWITCH

BACKGROUND OF THE INVENTION

1. Field of the Invention

The present invention relates to on-chip circuits for checking and testing integrated circuits, and more particularly to a circuit for on-line, testable self-checking of a differential cascode voltage switch.

2. Description of the Prior Art

U.S. Pat. No. 4,410,816 issued to Kanai on Oct. 18, 1983 and entitled ECL INTEGRATED CIRCUIT describes an ECL integrated circuit which comprises an emitterfollower transistor at the output stage and a pull-down resistor connected to the emitter-follower transistor. The ECL integrated circuit is provided with a test circuit on a line extending from the output of emitter-follower transistor to a subsequent stage so as to cause a test current to flow only at the time of the test. The test current is smaller than the current usually flowing to the pull-down resistor but larger than the current flowing to the subsequent stage.

U.S. Pat. No. 4,183,460 issued to Yuen et al on Jan. 15, 1980 and entitled IN-SITU TEST AND DIAGNOSTIC CIRCUITRY AND METHOD FOR CML CHIPS teaches the use of an in situ test and diagnostic circuit to monitor the integrity of external connections of a current mode logic integrated circuit chip (inputs and outputs) as well as the integrity of the logic function thereof. The circuit comprises three parts: an "open" input detector to detect open connections or connections that are becoming open between one chip and another; an output short detector to monitor shorts at any chip output; and a signature test and diagnostic circuit to determine if the logic function of the chip itself is operational. All the foregoing circuit parts are formed as an integral part of each CML chip and connected to an output terminal called a test and diagnostic pin.

U.S. Pat. No. 4,339,710 issued to Hapke on July 13, 1982 and entitled MOS INTEGRATED TEST CIRCUIT USING FIELD EFFECT TRANSISTORS describes an MOS integrated circuit arrangement with field-effect transistors including a circuit arrangement for rapidly testing various blocks of the circuit. This circuit arrangement includes three transistor-switch groups; a first group for testing an input block, a second group for connecting and disconnecting the input block and an output block so that the blocks may be tested in combination, and a third group for testing the output block.

SUMMARY OF THE INVENTION

An object of the present invention is to provide an improved circuit for on-chip, on-line checking and testing.

Another object of the present invention is to provide an improved circuit for on-line, self-test of a differential cascode voltage switch.

A further object of the present invention is to provide an improved on-line, on-chip checking and test circuit for a differential cascode voltage switch for testing for differential output, sampling data rate and for testing the test circuit.

The foregoing and other objects, features and advantages of the invention will be apparent from the following more particular description of the invention as illustrated in the accompanying drawings.

BRIEF DESCRIPTION OF THE DRAWINGS

FIG. 6 is a block diagram illustrating a LSSD chain associated with tester latches for providing tester addresses.

FIG. 7 is a schematic illustration of an embodiment of an on-chip layout for the test circuit on the tester-tester.

DESCRIPTION OF THE INVENTION

Differential Cascode Voltage Switch (DCVS) is a term which describes a logically complete circuit family for CMOS technology which uses and produces differential signals.

Figure 1:
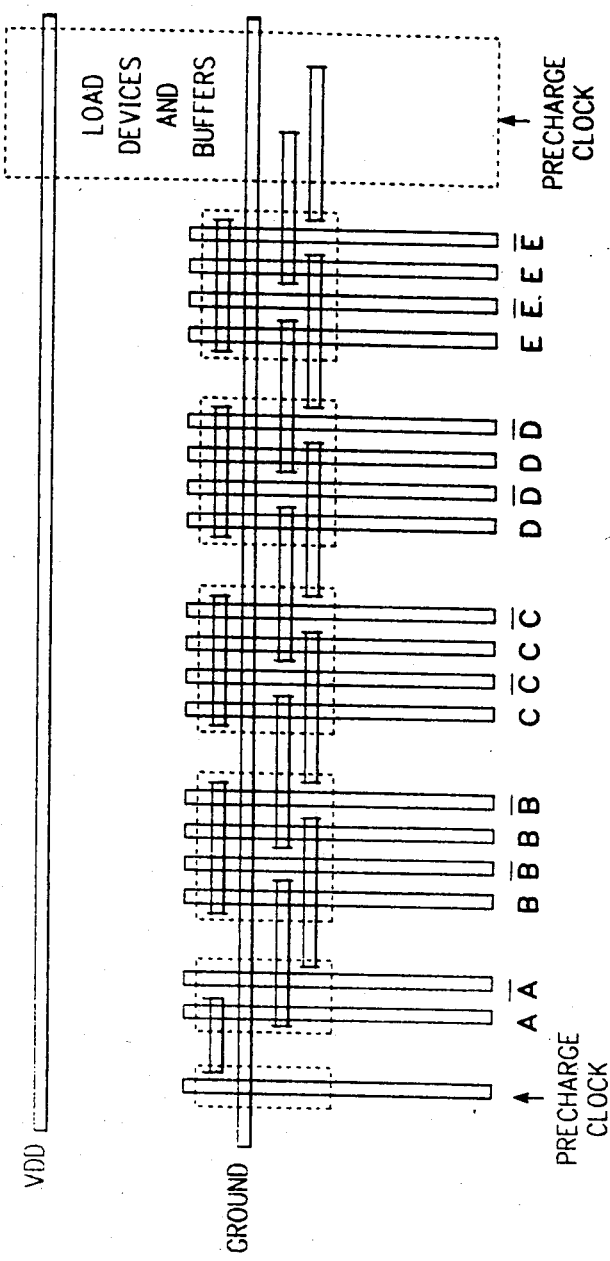
FIG. 1 is a schematic diagram of a differential cascode voltage switch XOR circuit used in the explanation of the present invention.
Figure 2:
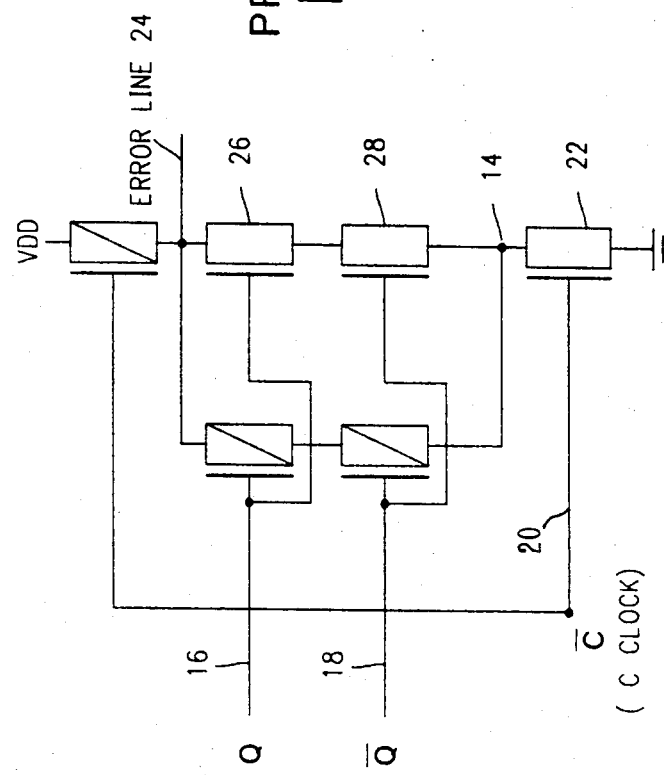
FIG. 2 is a schematic diagram of a prior art tester circuit.

A description of Differential Cascode Voltage Switch and its implementation are described in the publication "Cascode Voltage Switch Logic: A Differential CMOS Logic Family", by L. G. Heller, W. R. Griffin, J. W. Davis, N. G. Thoma, Digest of the ISSCC 1984, pp. 12-13 and consists of producing differential paths to ground from two nodes (called Q and $\bar{Q}$ respectively and represented by an ordered pair (Q, $\bar{Q}$)). A simple example of a five (A,B,C,D,E) input XOR gate follows in FIG. 1. Under normal operation, only one of two paths to ground is conducting, producing a differential (one signal is high and the other is low) output. This differential output is then either (1,0) or (0,1) under normal operation and (0,0) or (1,1) represents illegal states. It has been shown that no single failure will ever cause the output to change state from one legal state to another. Thus, the detection of an illegal state (1,1 or 0,0) of any logic tree is a clear indication of the presence of a fault in the logic tree. A circuit which detects this illegal state at the instant when the C-clock (designated C in FIG. 2) falls is known in the prior art and is shown in FIG. 2. For reliability, availability, and serviceability purposes, the circuits which test the trees must also be tested. This verifies that transient errors will be detected during field operation by setting each test circuit to the (1,1) and (0,0) states to show that the tester will detect failures. The legal states (1,0) and (0,1) can be reached by normal circuit operation. Additionally, using both the test circuit and the normal path allows the transistors connecting the tester and both the buffer and the test-tester to be checked. The testing circuit of FIG. 2 is the type which produces a single error signal. If the signal is high, no DCVS tree in the macro is in an error state at the instant when the C-clock falls. If this signal is low, at least one DCVS tree in the macro is on an error state at the instant when the C-clock falls.

The present invention provides an improved testing circuit which uses N-devices for both the (0,0) and (1,1) state detection and uses decoupling pass devices for sampling the data at the fall of the system C-clock, additionally allowing simultaneous precharging and error detection.

The present invention also provides an improved hierarchical scheme, which uses the system C-clock for input to the latches, decoupling of the buffers, and pulling up and down the error lines of the type which pull down in the event of an error. The error fault is held in a Level Sensitive Scan Design (LSSD) latch of a type known in the art. Also, the invention provides circuit level simulation of a scheme which self tests a large macro using only the C-clock and latches the result in a single latch.

Figure 3:
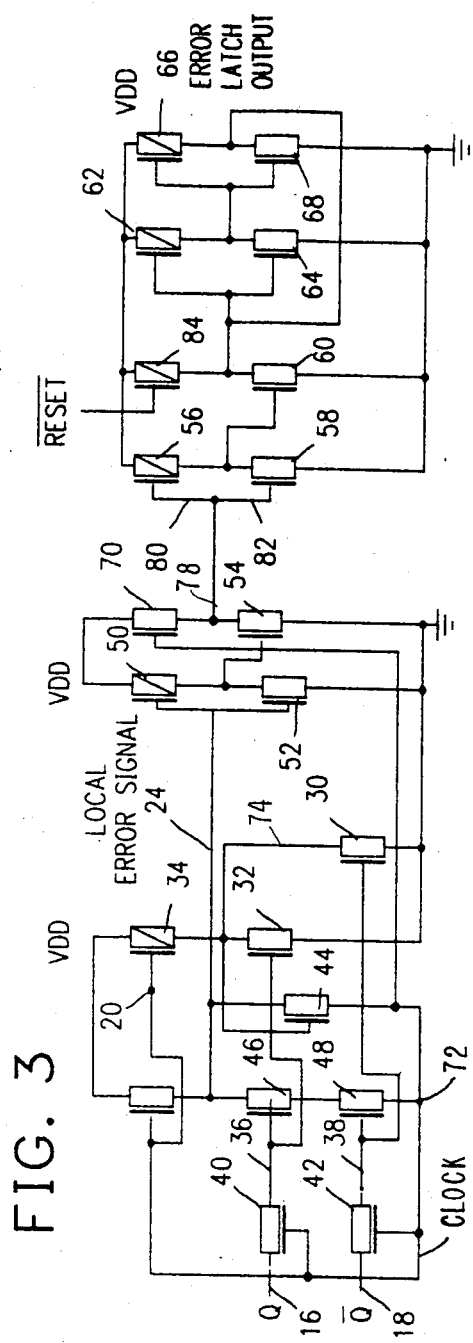
FIG. 3 is a schematic block diagram of an embodiment of an improved checking and tester circuit according to the principles of the present invention.

The prior art self-testing scheme illustrated in FIG. 2 and described in the IBM Technical Disclosure Bulletin, Vol. 27, No. 10B, (March 1985) in the article "Testing Scheme for Differential Cascode Voltage Switch Circuits" by J. B. Hickson, Jr. et al relies on two series P-devices 10 and 12 in order to detect the 0-0 output state from a DCVS tree. Initially, the Q signal on line 16 and the $\overline{Q}$ signal on line 18 are low (ground), the C-clock signal on lead 20 is high, device 22 is on, therefore node 14 is at ground. It is known that series P-devices 10 and 12 with their gates and one source grounded as shown in FIG. 2 will not produce an output on the error signal line 24 lower than one threshold above ground. A solution to this problem, as shown in FIG. 3, is to use the two signals in a NOR configuration, including devices 30,32 and pull-up device 34, thus detecting if neither the Q or $\overline{Q}$ signal, gated by the pass devices 40 and 42 respectively, has sufficient voltage to pull down the load device which consists of the P-device 34 whose gate is attached to the C-clock signal on line 20. The resulting signal is run to a gate of device 44 which is in parallel with the two N-devices 46 and 48. Thus, when the Q and $\overline{Q}$ signals on leads 16 and 18 are low, causing low signal conditions on leads 36 and 38 the NOR gate composed of devices 30,32 and 34 is allowed to rise and produce a pulldown leg to the error line 24. The positive implications of the circuit of FIG. 3 are that the N-device is faster at pulling down the signal line than the P-devices of FIG. 2 were and the tester operates in a manner identical to a tree, that is a failure results if either both signals are sufficiently high to turn on an N-device or neither signal is high enough to turn on an N-device. Therefore, the tester registers a failure if and only if there is the potential for a tree with the same inputs to enter an illegal state. Additionally, only one P-device is required. Thus, the present invention, as illustrated in the embodiment of FIG. 3, checks, at the time the C-clock falls, whether the Q and $\overline{Q}$ signals from the previous tree are orthogonal (1,0 or 0,1) in view of the fact that a single transistor failure (error) will not cause a 1,1 to 0,0 or 0,0 to 1,1 change. The time is an important feature because when the C-clock falls, precharge and decoupling occur and no additional cycle time is required for the error checking and testing.

In FIG. 3, the Q and $\overline{Q}$ input signals on leads 16 and 18 to the tester must be orthogonal (1,0 or 0,1) when the C-clock on lead 20 falls, since this is the instant when data is sampled by the latch, located elsewhere in the system, which accepts the same Q and $\overline{Q}$ signals. Therefore, the Q and $\overline{Q}$ signals at this instant should be decoupled and used by the tester at this time. Thus the C-clock signal is required by both the tester and the latch, thus reducing the wiring impact of the tester. The test circuit uses this C-clock for precharging, latching data into the storage node in the tester and tester evaluation. The circuit of the present invention has the advantage of reducing the number of clocks required to perform the testing operation, producing positive timing implications, since the evaluation phase uses the same clock as the decoupling devices and the latch input, thus reducing clock skew.

Figure 4:
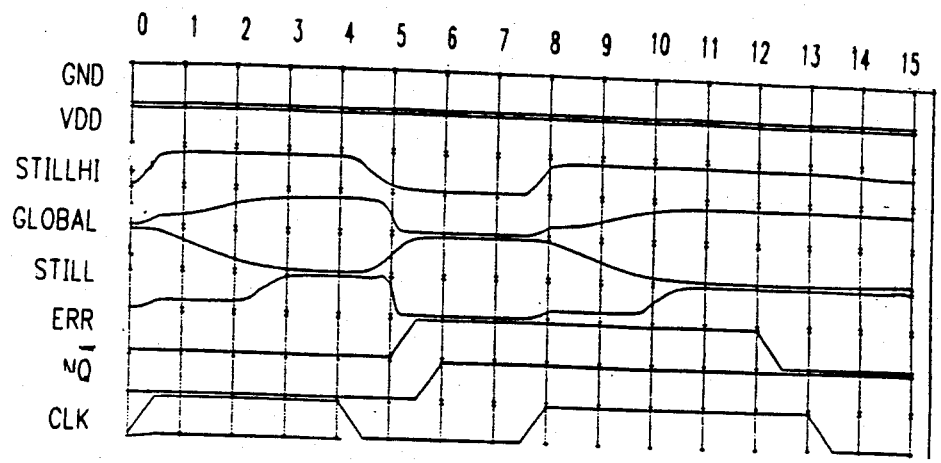
FIG. 4 is an illustration of a timing diagram useful in explaining the operation of the checking and tester circuit of FIG. 3.

An embodiment of an improved tester circuit according to its present invention and incorporating all the desirable, previously described features, is also shown in FIG. 3. The timing diagram for the various signal waveforms associated with the circuit of FIG. 3 is shown in FIG. 4.

In FIG. 3, the Q and $\overline{Q}$ input signals on leads 16 and 18 are applied to decoupling pass devices 40 and 42. During the precharge cycle, when the C-clock is down, both the Q and $\overline{Q}$ signals are precharged low.

The timing of the circuit of FIG. 3 is as follows. During the precharge cycle (when the C-clock is down), both Q and $\overline{Q}$ signals are precharged low. When the C-clock signal (on lead 20) rises, the decoupling devices 40 and 42 become conductive, thus transmitting the low Q and $\overline{Q}$ signals to the test circuit. Additionally, both the (local) error signal and lead 24 and the (global) error signal on lines 80 and 82 from OR device 54 are precharged high through an N-device 70 as shown in FIG. 3 (only one precharge transistor is required for each (local) error line, and as such it will be included at the inverter circuit consisting of devices 56 and 58 for the (local) error line. During the logic operation, neither, or one, or both of the Q and $\overline{Q}$ signals will rise. These transitions will be transmitted to the tester circuit. When the C-clock signal on lead 20 falls, three events occur:

In event one, first the decoupling devices 40 and 42 turn off, sampling the Q and $\overline{Q}$ signals in the tester circuit. Then in event two, when the C-clock signal goes low, and node 72 goes low, the drains of devices 44 and 48 are low. If both the Q and $\overline{Q}$ signals are high, (local) error line 24 will be discharged through the two N-devices 46 and 48.

Then, in event three, C-clock line 20 attains a low value. If neither Q or $\overline{Q}$ are high, the NOR line 74 will be charged through the P-device 34 which results in a pull-down of the (local) error line 24. This signal will appear on the gate of device 44 and discharge the error line 24. If exactly one of Q and $\overline{Q}$ signals are high, error line 24 will not be discharged since the NOR line 74 will be low (the N-devices in this circuit are large enough to dominate the P-device), and the series N-devices will not conduct.

The timing diagram of the circuit of FIG. 3 is shown in FIG. 4. States (0,0) and (1,0) are tested, the delay for the ORing together of, for example, one thousand nodes for an erroneous (0,0) state is shown to be less than ten nanoseconds in available CMOS technology. The waveforms of the local error signal the global error signal, and ERR (the output of the error latch) are also shown in FIG. 4.

In order to detect any error in a large number of trees, a hierarchical scheme must be devised which detects the 1,0 or 0,1 state in any one of many logic trees at the time that the C-clock goes low. This is accomplished by the circuit illustrated in FIG. 3 which further includes an inverter circuit, incorporating devices 50 and 52, connected to the (local) error signal line 24, followed by a distributed precharge OR circuit 54-1 (only one of a plurality such as ten being shown) which produces an error signal (global) which is connected via lines 80 and 82 to another inverter circuit which includes devices 56 and 58. Device 60 is one leg of a multi-input latch composed of devices 62,64,66 and 68.

A plurality (i.e., ten) error detection circuits with corresponding ten output error lines 24, and one of which may have a low error condition thereon, are connected and combined together through one inverter (devices 50 and 52) and one distributed precharge OR circuit 54.

A like plurality (i.e., ten) of precharge OR circuits 54 (each one with its associated ten error detection circuits) are in turn connected to one inverted circuit (devices 56 and 58) and latch circuit (devices 60,62,64,66 and 68).

Thus the first level of the hierarchy is shown in FIG. 3 wherein a plurality of ten error detection circuits are combined together so that any (local) error line 24 falling will drive the inverter (50 and 52). The inverter drives the distributed precharge OR circuit 54 which has the ground as its source and line 78 as its drain. A plurality such as ten of these drain lines 78 are tied to the (global) error lines 80 and 82 which covers two rows of DCVS trees. The (global) error signal is again inverted by devices 56 and 58. The resulting signal drives the gate of device 60 whose source is ground and whose drain is a port of a multi-input latch (62,64,66 and 68) as also shown in FIG. 3. The C-clock can be considered the gate clock for this latch (although there is a delay in its operation, due to the OR operation). If the delay between the falling of the C-clock and the falling of the system B-clock is greater than the delay through the AND hierarchy, the error information can be propagated to the B-clock at the same time as the results are propagated, thus providing excellent EDFI, (Error Detection, Field Inspection). This latch also has a reset line which through device 84 clears the value. Unless this reset line is lowered, the latch will retain error state. Thus, the latch will have a low value if any DCVS tree was in an error state when the C-clock fell during any cycle since the last reset of the latch, allowing data compression of the test result to a single bit. In conjunction with pseudo- random techniques, this allows full speed testing with greatly increased observability.

The circuit of FIG. 3 described hereinabove allows error detection at the tree level of any DCVS macro. Since the output is compressed to a single bit for multiple cycles, the circuit has significant applicability for reduced cost initial chip testing. Additionally, since the result appears before the next cycle begins, there are implications for real time fault detection. Finally, the possibilities for redundancy utilization (i.e., selection of the outputs from redundant macros which are in a valid state) are significant.

The circuit of FIG. 3 requires only ten to twenty percent additional area in a master image environment and thus provides a cost efficient, high observability, practical, fast, self-testing scheme for the Clocked DCVS Circuit family.

Figure 5:
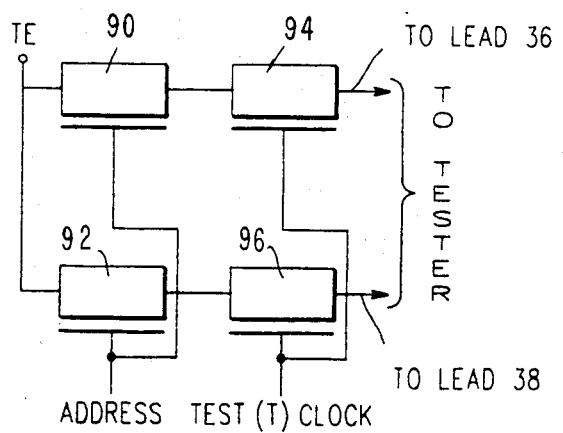
FIG. 5 is a schematic diagram of an embodiment of a circuit for testing a tester circuit.

The basic principles of the tester-tester circuit of the present invention are to individually address each tester circuit in a macro, and test whether the (global) error line 78 drops under (1,1)/(0,0) conditions. An embodiment of a circuit to implement this concept is shown in FIG. 5. A test data input line (TE) is used to determine which illegal value will be used as input to the tester. These values are gated by pass devices 90,92 whose gate is the address signal. The resulting signals are sent through pass devices 94,96 gated by the test clock. The outputs of devices 94,96 are applied to lines 36 and 38 of the tester of FIG. 3.

The test circuit is operated as follows. A single address line in the system memory is raised to test the associated test circuit. The TE (TEST ERROR STATE) line is appropriately set for test mode (i.e., to produce either (1,1) or (0,0)). Also, the T (test) clock is activated, allowing either the (1,1) or (0,0) state to enter the tester (via leads 36,38) as soon as the C-clock signal (node 72) falls. Then, the error line 78 is precharged by a step of normal operation. The falling of the C-clock activates the tester mechanism, decouples the test inputs from the Q and $\overline{Q}$ outputs, allowing the test data to dominate, and cause the error line to fall.

The address of a tester circuit of FIG. 5 can be generated in at least two ways, depending on the generality of the testers being tested and the wiring cost.

First, if the tester circuits that are to be tested are associated with the inputs to the latches only, then the address can be generated using the LSSD chain associated with the latches as shown in FIG. 6. A vector with all '0' values and one '1' value can be loaded to the LSSD chain, and the single '1' location can be used to enable one tester. The clocking of such latches would be as follows: A,B,A,B ... A,B (loading the test sequence) C (precharging the error lines) T (loading the value of TE to the tester), C falls (activating the tester), A (moving the test vector). This clocking scheme would allow the L1 latches to receive data, while the L2 latches held the tester-tester pattern. Additionally, the speed of the tester-tester could be verified. Thus, the tester address pattern can be maintained by using the A-clock to move the L2 data (the address pattern) to the next L1 in the chain.

Second, if the testers which are to be tested are more general in nature, an additional latch chain, with as many latches as the number of elements to be tested, and gated by the A-clock, can be used to produce the '1' in any location needed. It should be noted that a scan system allows the latches to be tested by scanning out the final value. Additionally, notice that two pieces of information, the test clock, the chain of addresses, and the error line must be connected between each tester, and the tester-test time is proportional to the number of testers in a macro, since each tester must be tested independently. Thus, each tester can be independently addressed with only clock and one data line between address units. Additionally, the information in the unit can be verified by reading the output of the scan path.

Testing circuitry is only valuable if the circuitry is reliable. That is, any transistor or node which fails in the manner previously discussed should be detectable. Each transistor in the testable DCVS self-tester can be tested for a constant nonconduction state or a constant conduction state (stuck open/closed). In the following discussion, the transistor failures will be divided into equivalence classes and a test sequence will be discussed for each.

First, the pass devices gated by the C-clock between the DCVS buffers and the corresponding outputs should be tested. If one is stuck closed, setting the opposite signal to '0' should detect this failure since the closed device will transmit the low value during testing time. This assumes that the overlap between the C-clock being low and the Q and $\overline{Q}$ precharging is sufficiently long to activate the error latch. If one is stuck open, using the test-tester to load a '1', turning off the test-tester clock, and producing a pattern with a '0' in the stuck open position will cause a (1,1) pattern and activate the error line.

Secondly, the pass devices 94,96 gated by the T-clock between the test-tester and the inputs to the DCVS tester should be tested. If one is stuck closed, setting the address line to the corresponding circuit and putting both input combinations on the input to the latch will detect this failure. The stuck closed transistor will force the error line to fall without the T-clock since one of the paths from the tester to the test data line will force a value on the tester, independent of the Q output. Thus a (1,0) output will become a (1,1) at the tester. If one is stuck open, setting the address line to the corresponding circuit putting the TE line to force (1,1) or (0,0) and putting both input combinations (1,0) and (0,1) on the input to the latch followed by the test clock will detect the open transistor since one of the two tests will produce an input state to the tester which is legal.

Finally, the pass devices gated by the address should be tested. If one is stuck closed, setting all address lines off and operating the test clock will cause the error line to drop if the TE line is set in an illegal state. If one is stuck open, setting the corresponding address lines on and operating the test clock will not cause the error line to drop.

Tests for the test-tester can be automatically generated using the Boolean equations for the tester circuit and an automatic test generation program using techniques known to one skilled in art.

An improved, cost efficient, self-testing scheme for DCVS has been described. A circuit which used the C-clock as a natural timing structure, and signals an error if any "complementary pair" of signals are either both sufficiently high to cause two series nMOS devices to conduct, or neither sufficiently high to cause two parallel nMOS devices to conduct.

Additionally, circuitry and techniques are provided to test the testing circuitry. Using either the LSSD chain, or an independent scan ring and a small number of devices per tester, the functionality of each tester can be verified. Additionally, a test sequence is described which verifies the functionality of the tester-test circuitry. The checking and testing circuit can be efficiently and compactly fabricated on a single device site on a chip as typically illustrated in FIG. 7.

Having thus described our invention, what we claim as new, and desire to secure by Letters Patent is:

1. A testing circuit for a differential cascode voltage switch system for producing an error signal on an error line in response to an invalid signal condition on a pair of Q and $\overline{Q}$ switch lines having Q and $\overline{Q}$ signals thereon from said switch system, comprising first error detection means for producing a first (local) error signal including, a C-clock input signal lead responsive to a C-clock signal from said switch system being tested, first and second decoupling pass transistor devices respectively connected to said Q and $\overline{Q}$ lines from said switch being tested, and to said C-clock input signal lead, a NOR circuit including first, second and third devices, said first and second NOR circuit devices respectively connected to the outputs of said first and second pass transistor devices and said third NOR circuit device being connected to said C-clock signal lead, said NOR circuit functioning to detect when said Q and $\overline{Q}$ signals from said first and second pass transistor devices are at a given (invalid) signal level, and for producing a first level (local) error signal when said Q and $\overline{Q}$ signals and said C-clock signal are at given signal levels, and a (local) error signal output lead connected to said NOR circuit.

2. A testing circuit according to claim 1 wherein said invalid signal condition on said pair of Q $\overline{Q}$ lines is manifested by both lines being high (1,1) or both lines being low (0,0), said first error detection means for said testing circuit further including a pair of high speed devices connected to said (local) error signal output lead for rapidly discharging said (local) error signal output lead when said Q and $\overline{Q}$ lines are both high and said C-clock signal is at said given signal level.

3. A testing circuit according to claim 2 wherein said first error detection means of said testing circuit further includes a discharge device connected to said (local) error signal output lead and to said NOR circuit for discharging said (local) error signal output lead when said Q and $\overline{Q}$ lines are both low and said C-clock signal is at said given signal level, said discharging of said (local) error signal output lead being said (local) error signal indicating said invalid (1,1 or 0,0) signal condition on said Q and $\overline{Q}$ switch lines.

4. A testing circuit according to claim 3 further including means for producing a second level (global) error signal which includes second error detection means connected to a plurality of said (local) error signal output leads of a plurality of said first error detection means for producing said second level (global) error signal upon the occurrence of at least one first level (local) error signal on at least one of said plurality of said (local) error signal output leads from said plurality of first error detection means.

5. A testing circuit according to claim 4 wherein said second error detection means includes an OR circuit connected to said plurality of said (local) error signal output leads from said plurality of first error detection means for producing said second level (global) error signal upon the occurrence of said at least one (local) error signal from a first error detection means.

6. A testing circuit according to claim 5 wherein said testing circuit further includes a latching circuit connected to a plurality of said second error detection means for producing an error latch output signal upon the occurrence of at least one second level (global) error signal from a second level error detection means.

7. A testing circuit according to claim 6 further including a self-checking circuit means for testing said testing circuit including means for generating a test mode signal consisting of a 1,1 signal condition or a 0,0 signal condition, means, including transistor pass devices, responsive to said test mode signal for producing said 1,1 or 0,0 signal condition respectively on first and second self-checking output levels, said first and second self-checking output leads being connected respectively to the output leads of said first and second decoupling pass transistors of a first error detection means for simulating a first (local) error signal.

* * * * *